(12) United States Patent
Wang et al.

(10) Patent No.: US 8,951,864 B2
(45) Date of Patent: Feb. 10, 2015

(54) SPLIT-GATE DEVICE AND METHOD OF FABRICATING THE SAME

(75) Inventors: Yu-Hsiung Wang, Zhubei (TW); Chih-Ren Hsieh, Changhua (TW); Tung-Sheng Hsiao, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/371,755

(22) Filed: Feb. 13, 2012

(65) Prior Publication Data
US 2013/0207174 A1    Aug. 15, 2013

(51) Int. Cl.
*H01L 21/336* (2006.01)
*H01L 27/115* (2006.01)

(52) U.S. Cl.
USPC .... 438/267; 438/257; 257/624; 257/E21.423; 257/E21.209

(58) Field of Classification Search
USPC .............. 257/316, 324, E21.423, E21.209, 257/E29.309; 438/257
See application file for complete search history.

(56) References Cited

U.S. PATENT DOCUMENTS

| | | | |
|---|---|---|---|
| 6,642,103 B2 * | 11/2003 | Wils et al. ............... | 438/257 |
| 8,174,062 B2 * | 5/2012 | Ashida ................... | 257/316 |
| 2002/0153546 A1 * | 10/2002 | Verhaar .................. | 257/296 |
| 2004/0014274 A1 * | 1/2004 | Wils et al. ............... | 438/222 |
| 2004/0065917 A1 * | 4/2004 | Fan et al. ................ | 257/315 |
| 2004/0238878 A1 * | 12/2004 | Sato et al. ............... | 257/315 |
| 2006/0163642 A1 * | 7/2006 | Widdershoven et al. .... | 257/315 |
| 2007/0018207 A1 * | 1/2007 | Prinz .................... | 257/288 |
| 2008/0029805 A1 * | 2/2008 | Shimamoto et al. ....... | 257/315 |
| 2008/0265286 A1 * | 10/2008 | Ishimaru et al. ......... | 257/214 |
| 2009/0207662 A1 * | 8/2009 | Wang et al. ............ | 365/185.18 |
| 2010/0163952 A1 | 7/2010 | Jan et al. | |

* cited by examiner

*Primary Examiner* — Cheung Lee
*Assistant Examiner* — Jeremy Joy
(74) *Attorney, Agent, or Firm* — Haynes and Boone, LLP (57) ABSTRACT

A semiconductor device includes a substrate; a storage element disposed over the substrate in a first region; a control gate disposed over the storage element; a high-k dielectric layer disposed on the substrate in a second region adjacent the first region; and a metal select gate disposed over the high-k dielectric layer and adjacent to the storage element and the control gate.

20 Claims, 13 Drawing Sheets

SPLIT-GATE DEVICE AND METHOD OF FABRICATING THE SAME

BACKGROUND

The semiconductor integrated circuit (IC) industry has experienced rapid growth. Technological advances in IC materials and design have produced generations of ICs where each new generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component or line that can be created using a fabrication process) has decreased. This scaling-down process generally provides benefits by increasing production efficiency and lowering associated costs.

During the scaling trend, various materials have been used for the gate electrode and gate dielectric in field effect transistors (FET). One approach is to fabricate these devices with a metal material for the gate electrode and a high-k dielectric for the gate dielectric. However, high-k metal gate (HKMG) devices often require additional layers in the gate structure. For example, work function layers may be used to tune the work function values of the metal gates. Although these approaches have been generally adequate for their intended purposes, they have not been satisfactory in all respects. For example, select gates for high speed read selection from a storage element should be integrated with HKMG processing, and flash cells should be embedded in HKMG technologies.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity. It is noted that the same or similar features may be similarly numbered herein for the sake of simplicity and clarity. In addition, some of the drawings may be simplified for clarity. Thus, the drawings may not depict all of the components of a given apparatus (e.g., device) or method.

Various aspects of the present disclosure will be described herein with reference to drawings that are schematic illustrations of idealized configurations of the present disclosure. As such, variations from the shapes of the illustrations as a result, for example, manufacturing techniques and/or tolerances, are to be expected. Thus, the various aspects of the present disclosure presented throughout this disclosure should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

Figure 1:
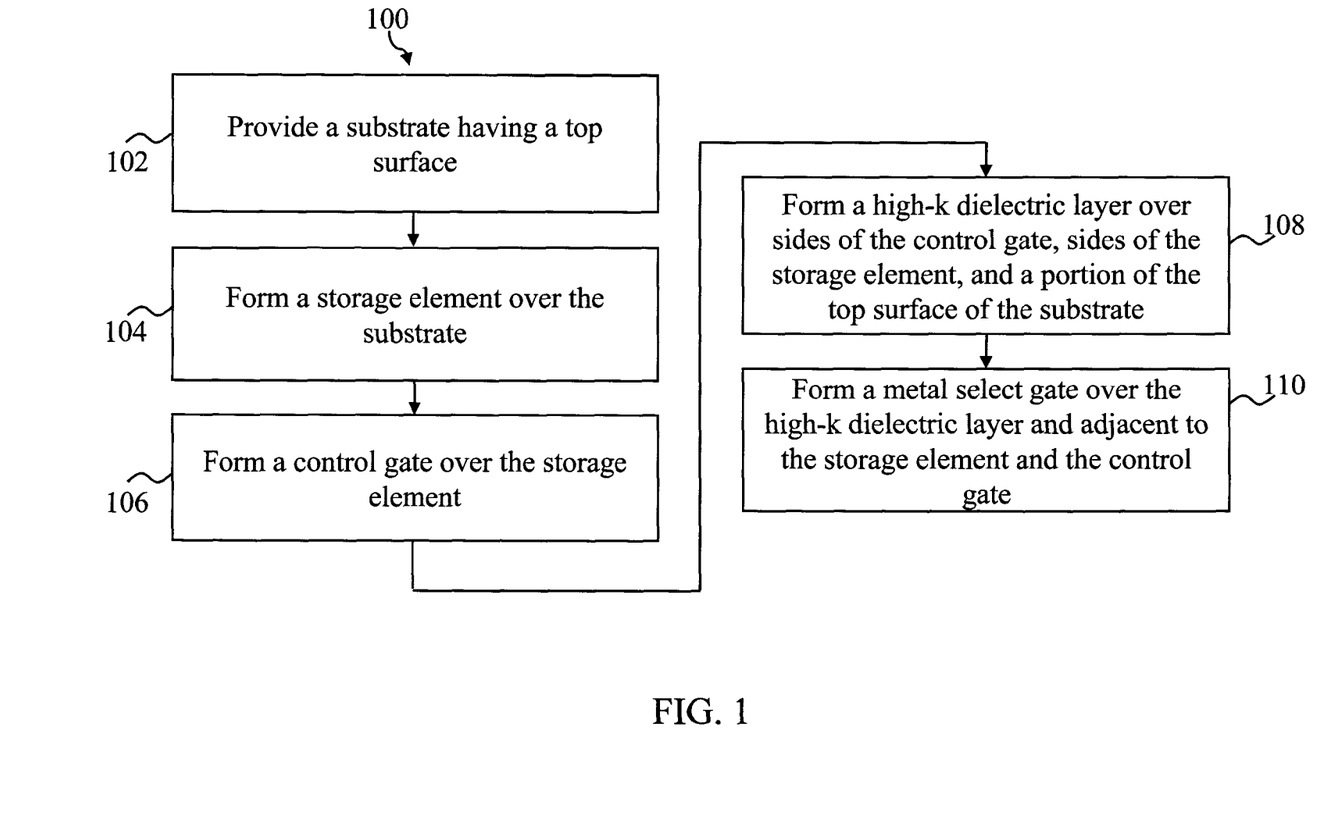
FIG. 1 is a flowchart showing a method of fabricating a semiconductor device in accordance with embodiments of the present disclosure.

Referring now to FIG. 1, a flowchart shows a method 100 of fabricating a semiconductor device in accordance with embodiments of the present disclosure. Method 100 includes providing a substrate having a top surface at block 102, forming a storage element over the substrate at block 104, forming a control gate over the storage element at block 106, forming a high-k dielectric layer over sides of the control gate, sides of the storage element, and a portion of the top surface of the substrate at block 108, and forming a metal select gate over the high-k dielectric layer and adjacent to the storage element and the control gate at block 110.

It should be noted that the operations of method 100 may be rearranged or otherwise modified within the scope of the various aspects. It is further noted that additional processes may be provided before, during, and after the method 100, and that some other processes may only be briefly described herein. Thus, other implementations are possible within the scope of the various aspects described herein. As another embodiment, the high-k dielectric layer is formed on the substrate but not on the sides of the control gate and the storage element.

According to an aspect of the present disclosure, the method may further comprise simultaneously fabricating the metal select gate and metal oxide semiconductor (MOS) transistor using high k dielectric metal gate (HKMG) technique.

According to another aspect of the present disclosure, the method may further comprise simultaneously fabricating with the metal select gate, a metal oxide semiconductor (MOS) transistor over a complementary metal oxide semiconductor (CMOS) region of the substrate.

According to yet another aspect of the present disclosure, the method may further comprise forming a source region in the substrate adjacent the storage element and the control gate, and forming a drain region in the substrate adjacent the select gate.

According to yet another aspect of the present disclosure, the method may further comprise forming an interlayer dielectric over the storage element, the control gate, the high-k dielectric layer, the metal select gate, the source region, and the drain region; forming a first contact operably coupled to the source region through the interlayer dielectric; and forming a second contact operably coupled to the drain region through the interlayer dielectric.

According to yet another aspect of the present disclosure, the method may further comprise forming an erase gate over the source region and the high-k dielectric layer; forming an interlayer dielectric over the erase gate, the storage element, the control gate, the high-k dielectric layer, the metal select gate, the source region, and the drain region; and forming a contact operably coupled to the drain region through the interlayer dielectric.

Figure 2A:
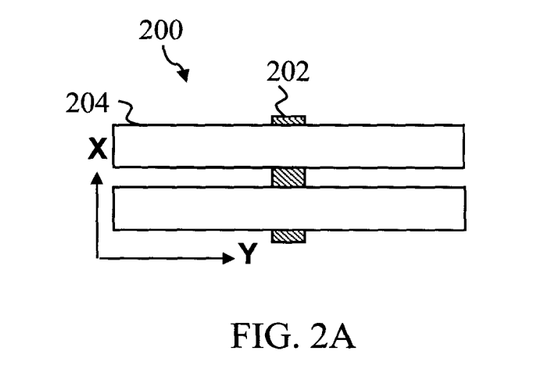
FIGS. 2A and 2B illustrate a diagrammatic fragmentary top view and a sectional view, respectively, of a semiconductor device at a stage of fabrication in accordance with embodiments of the present disclosure.
Figure 2B:
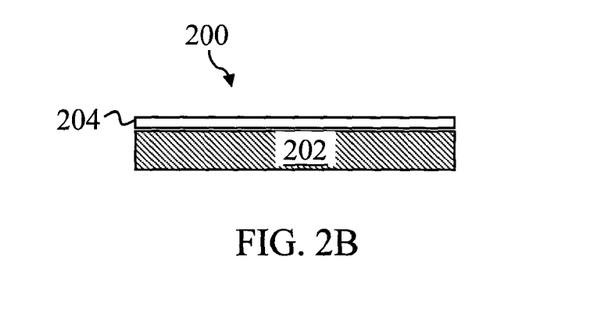
Figure 3A:
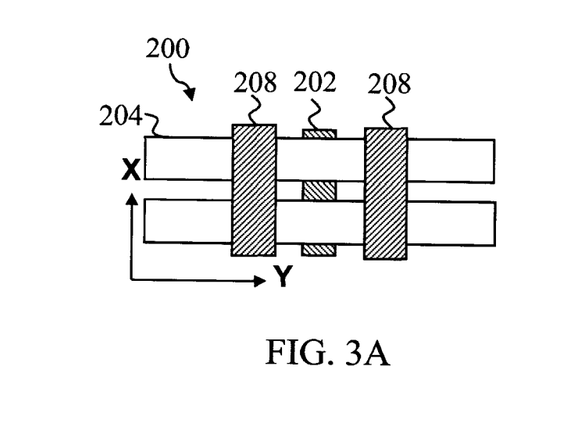
FIGS. 3A and 3B illustrate a diagrammatic fragmentary top view and a sectional view, respectively, of a semiconductor device at another stage of fabrication in accordance with embodiments of the present disclosure.

Referring now to FIGS. 2B, 3B, and 4-12, sectional views of a semiconductor device 200 at various stages of fabrication are illustrated in accordance with embodiments of the present disclosure, and referring to FIGS. 2A and 3A, top views of the semiconductor device 200 at respective stages of fabrication are illustrated in accordance with embodiments of the present disclosure. It should be understood that additional processes may be provided before, during, and/or after the stages illustrated in FIGS. 2-12, and that some selected processes may only be briefly described if they are well known in the art.

FIGS. 2A and 2B illustrate semiconductor device 200 including a substrate 202 having a top surface, and a storage element layer 204 disposed over the substrate 202. In one embodiment, the semiconductor device is formed on a silicon semiconductor substrate 202. Alternatively, the semiconductor substrate 202 could be: an elementary semiconductor including germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the storage element layer 204 is comprised of polysilicon, a nano-crystal film, or a nitride film.

Different devices (e.g., analog or digital devices) on the substrate 202 may be separated by isolation structures, such as a dielectric isolation feature. In one embodiment, an isolation structure may utilize shallow trench isolation (STI) to define active regions and electrically isolate devices. An isolation structure may be composed of silicon oxide in one example. However, in other alternative embodiments, the dielectric material could be silicon nitride, silicon oxynitride, other suitable materials, and/or combinations thereof. An isolation structure may alternatively have a multi-layer structure such as a thermal oxide liner layer filled with silicon nitride or silicon oxide.

Figure 3B:
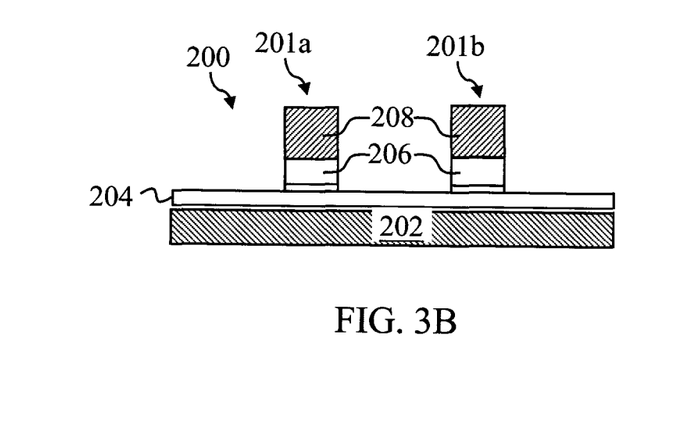

FIGS. 3A and 3B illustrate semiconductor device 200 including control gates 206 disposed over the storage element layer 204, and capping elements 208 disposed over respective control gates 206. In one example, control gates 206 are comprised of polysilicon. In one example, the capping element 208 is comprised of a dielectric material, such as an oxide, silicon nitride, or a combination of dielectric films, and is used as an etch or planarization (e.g., CMP) stopping layer or sacrificial layer.

Figure 4:
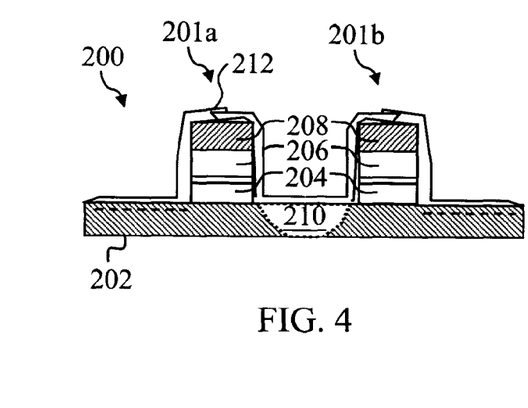
FIGS. 4-12 illustrate sectional views of a semiconductor device at various stages of fabrication in accordance with embodiments of the present disclosure.

FIG. 4 illustrates an etch of the storage element layer 204 to form first and second stack gate structures 201a and 201b, each stack gate structure including a storage element 204 disposed over substrate 202, a control gate 206 disposed over the storage element 204, and a capping element 208 disposed over the control gate 206. Storage elements 204 are self-aligned with the control gate 206, and in one example is a polysilicon floating gate, a nano-crystal film, or a nitride film.

A dielectric layer 212 is then conformally formed over the top and side surfaces of the first and second stack gate structures 201a and 201b to form a recess between the first and second stack gate structures 201a and 201b. The dielectric layer recess has interior sidewalls formed by dielectric layer 212. In one embodiment, the dielectric layer 212 may be comprised of silicon nitride, silicon oxynitride or other suitable dielectric material. The dielectric layer may be formed by a suitable technology, such as chemical vapor deposition (CVD) or spin-on coating.

A source region 210 is then formed in substrate 202 underneath the recess of the dielectric layer 212 formed between the first and second stack gate structures 201a and 201b. In one embodiment, source region 210 is aligned by the interior sidewalls of the dielectric layer recess.

Figure 5:
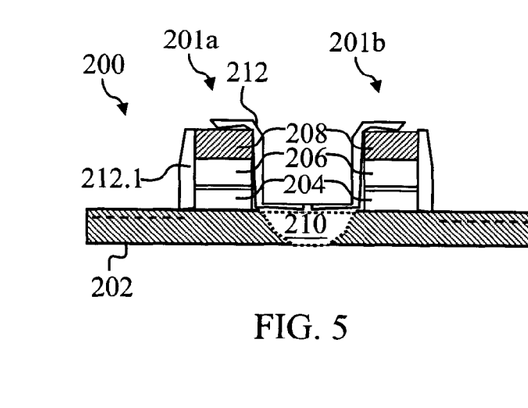

FIG. 5 illustrates an etch of the dielectric layer 212 to form sidewall spacers 212.1 on the outer sides of the first and second stack gate structures 201a and 201b.

Figure 6:
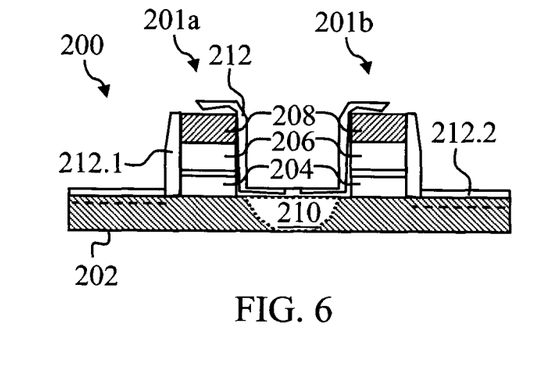

FIG. 6 illustrates formation of an HK dielectric layer 212.2 over a portion of the top surface of the substrate 202 and adjacent to the sidewall spacers 212.1. HK dielectric layer 212.2 functions as a select gate dielectric layer for a subsequently formed select gate. In one embodiment, HK dielectric layer 212.2 may be comprised of hafnium oxide (HfOx), hafnium silicon oxide (HfSiO), and/or hafnium silicon oxynitride (HfSiON), and may have a thickness in a range from about 20 Å to about 200 Å, but could alternatively have some other thickness. HK dielectric layer 212.2 may be formed as a single layer, or it may optionally include additional layers such as an interfacial layer between the substrate surface and the remainder of the HK dielectric layer.

In one embodiment, a complementary metal oxide semiconductor (CMOS) including a high-k metal gate (HKMG) metal oxide semiconductor (MOS) is fabricated over a different region of substrate 202 (e.g., in a CMOS region of the substrate) simultaneously with the HK dielectric layer 212.2 to form a peripheral MOS HK dielectric layer.

Figure 7:
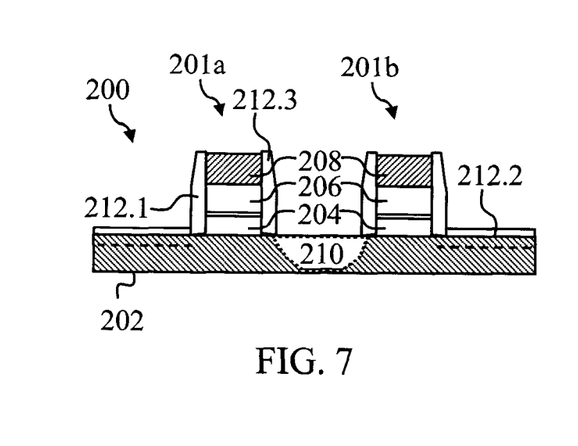

Referring to FIG. 7, sidewall spacers 212.3 may be formed on the inner sides of the first and second stack gate structures 201a and 201b. In one embodiment, the sidewall spacers 212.3 are formed from the dielectric layer 212 in an etch process to form the sidewall spacers 212.1. In another embodiment, the sidewall spacers 212.3 are formed from the high K dielectric layer 212.2 by an etch process. In yet another embodiment, the sidewall spacers 212.1 and 212.3 include two layers from the dielectric layer 212 and the high K dielectric layer 212.2.

In the present embodiment, sidewall spacers 212.1 and 212.3 are formed adjacent the exposed exterior sidewalls and the exposed interior sidewalls of the first and second stack gate structures 201a and 201b, respectively. As noted above, although sidewall spacers 212.1 and 212.3 are formed independently in this embodiment, the sidewall spacers 212.1 and 212.3 may be formed simultaneously in other embodiments. The sidewall spacers may be comprised of a dielectric material, such as silicon nitride. Alternatively, the spacers may be silicon carbide, silicon oxynitride, other suitable materials, and/or combinations thereof. Also, they may each be composed of a different material.

In another embodiment, source is formed with sidewall spacers in a procedure including multiple steps. For example, a light doped source features is formed by an ion implantation with a light dose, the sidewall spacers 212.1 (and 212.3) are formed by deposition and etching, thereafter, heavily doped source is formed by another ion implantation with a heavy dose.

Figure 8:
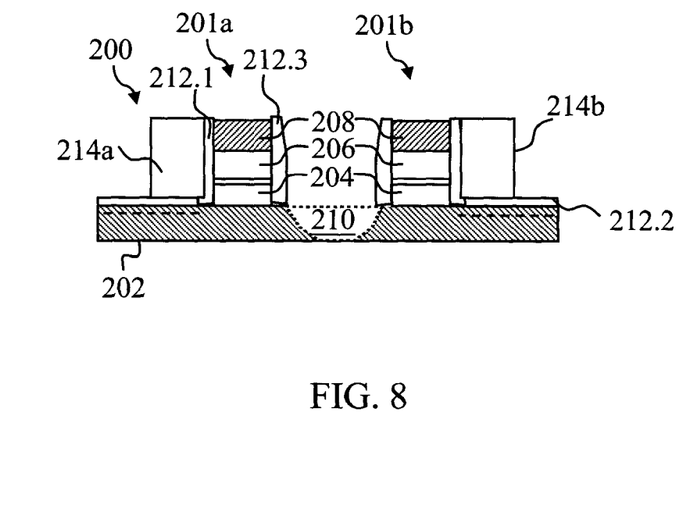

FIGS. 8 through 11 illustrate formation of the metal select gate in a metal gate last process according to one embodiment. Referring to FIG. 8, a first polysilicon select gate 214a is formed over the HK dielectric layer 212.2 on a top surface of substrate 202 and adjacent to the first stack gate structure 201a, and a second polysilicon select gate 214b is formed over the HK dielectric layer 212.2 on a top surface of substrate 202 and adjacent to the second stack gate structure 201b. First and second polysilicon select gates may be formed by polysilicon deposition, polysilicon planarization by CMP or etch, and polysilicon patterning (e.g., via photolithography and etch techniques). In one embodiment, a CMOS is fabricated over a different region of substrate 202 simultaneously with the polysilicon select gates 214 to form a peripheral MOS polysilicon, planarization of the polysilicon through CMP or etch, and patterning.

Figure 9:
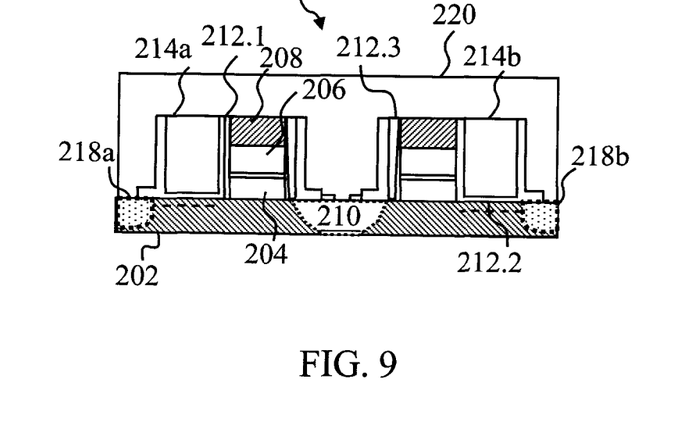

FIG. 9 illustrates formation of a first drain region 218a formed in the substrate 202 adjacent the first polysilicon select gate 214a and a second drain region 218b formed in the substrate 202 adjacent the second polysilicon select gate 214b. An interlayer dielectric (ILD) layer 220 is then formed over the topography of the structures of device 200, such as the sidewall spacers 212.1 and 212.3, select gates 214a and 214b, source 210, and drains 218. In one embodiment, a CMOS is fabricated over a different region of substrate 202 simultaneously with the sidewall spacers, drain regions 218, and ILD layer 220 to form peripheral MOS spacers, source/drain regions, and ILD layers.

The source and drain regions 210, 218 are doped regions having a dopant implanted therein that is appropriate for the design requirements of the associated device. When the source and drain regions are parts of pMOS transistors, source and drain regions are p-type doped with p-type dopants such as boron or $BF_2$ or combinations thereof. Alternatively, if the source and drain regions are parts of nMOS transistors, they may be n-type doped with n-type dopants, such as phosphorus or arsenic, or combinations thereof.

A channel region is defined between the source region 210 and the drain region 218 in the substrate 202. The channel region is an active region in the substrate in which the majority carriers flow between the source and drain regions when the device is in a conduction mode. Thus, a select gate and a stack gate structure are over the channel region between the source and drain regions.

Figure 10:
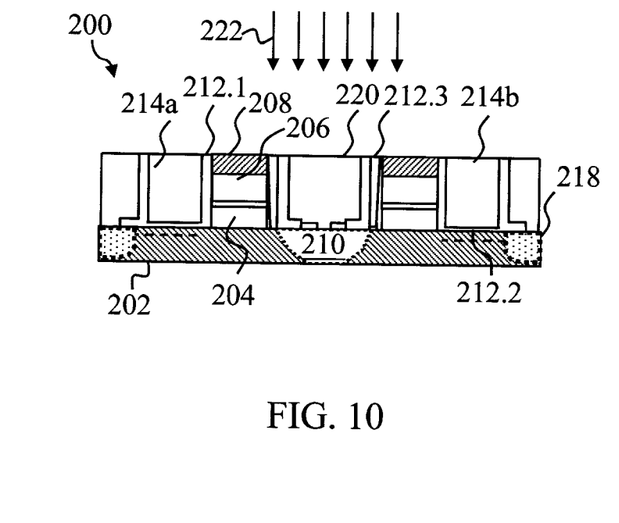

FIG. 10 illustrates planarization of the ILD layer 220, portions of the sidewall spacers 212.1 and 212.3, and select gates 214a and 214b until select gates 214 and capping elements 208 are exposed. The planarization process, such as chemical mechanical planarization (CMP) or an etch in one example, is shown by arrows 222. In one embodiment, a CMOS is fabricated over a different region of substrate 202 simultaneously with the exposure of the polysilicon select gates 214 to expose peripheral MOS transistor polysilicon.

Figure 11:
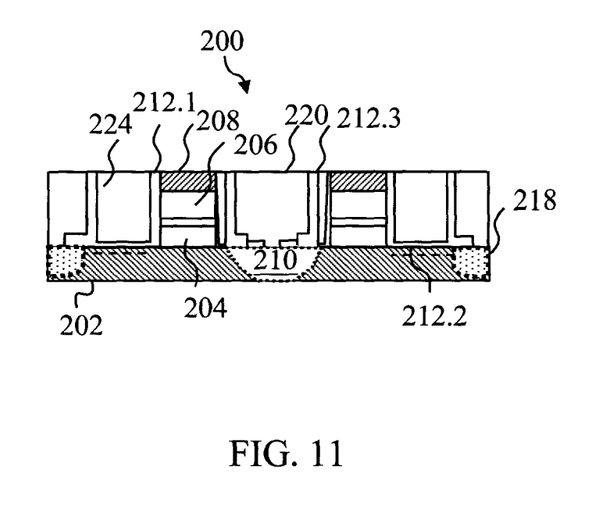

FIG. 11 illustrates removal of polysilicon select gates 214, deposition of a metal gate film, and metal gate planarization to form metal select gates 224. In one embodiment, a peripheral MOS is fabricated simultaneously with the metal select gate 224 over a different region of substrate 202 (e.g., a peripheral MOS transistor is formed simultaneously by simultaneous removal of a peripheral MOS transistor polysilicon gate, deposition of a metal gate film, and metal gate planarization).

In this gate replacement process, the polysilicon select gates are removed and replaced with metal select gates. In one embodiment, a non-illustrated photoresist layer may be deposited and patterned to facilitate etching that effects the removal. The polysilicon gates may be removed by any suitable process, such as a dry etching and/or wet etching process. After etching away the polysilicon and then stripping the photoresist, a metal layer may be formed and then planarized to form the metal select gate structures.

Metal select gate structures are formed with HKMG gate stacks for MOS transistors simultaneously in an integrated process for process compatibility and performance enhancement. Metal select gate structures can be formed with HKMG gate stacks for MOS transistors in a different procedure according to other embodiments.

In another embodiment, the metal select gate structures are formed with HKMG gate stacks for MOS transistors in a high k last process wherein the high k dielectric layer 212.2 is formed after the removal of the polysilicon select gates 214. In this embodiment, the removal of the polysilicon select gates 214 result in gate trenches. The high K dielectric layer is deposited in the gate trenches and thereafter, the metal gate film is deposited on the high K dielectric layer. In this case, the high K dielectric layer is also formed on the sidewalls of the gate trenches.

In yet another embodiment, the metal select gate structures are formed with HKMG gate stacks for MOS transistors in a gate first process. In this embodiment, instead of depositing the polysilicon layer 214, the metal gate film is directly deposited on the high K dielectric layer 212.2 to form the metal select gate structure. In this case, the gate replacement, as illustrated in FIG. 11, is eliminated. In furtherance of the example, the high K dielectric layer is formed on the sides of the storage elements 204 and the control gates 206.

In yet another embodiment, the gate dielectric layer for the metal select gates includes an interfacial layer, such as silicon oxide, between the high K dielectric layer 212.2 and the substrate 202. In yet another embodiment, the metal select gates include multiple metal films, such as a first metal film having a proper work function (also referred to as work function metal) and a second metal layer (such as aluminum) disposed on the first metal film. In this case, the first metal layer includes different material for nMOS and pMOS transistors with enhanced circuit performance. Furthermore, the first metal layer for the metal select gate may include the same metal material for nMOS transistors if the source 210 and drain 218 are n-type or alternatively include the same metal material for pMOS transistors if the source 210 and drain 218 are p-type.

Figure 12:
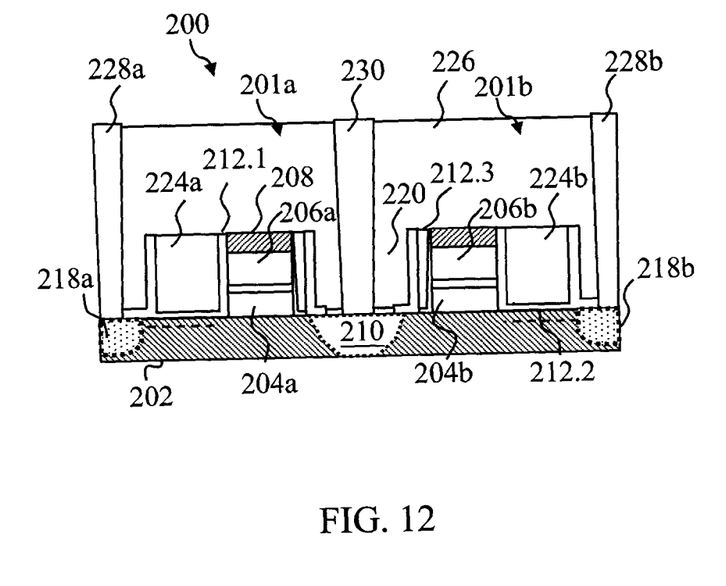

FIG. 12 illustrates formation of an ILD layer 226 over the topography of the structures of device 200, such as the sidewall spacers 212.1 and 212.3, select gates 224, capping elements 208, source 210, and drains 218. Contacts 228 and 230 are then formed through ILD layer 226 to operably couple to drains 218 and source 210, respectively.

FIG. 12 thus illustrates a semiconductor device 200 including a substrate 202 having a top surface; a first stack gate structure 201a including a first storage element 204a disposed over the substrate 202 and a first control gate 206a disposed over the first storage element 204a; a second stack gate structure 201b including a second storage element 204b disposed over the substrate 202 and a second control gate 206b disposed over the second storage element 204b; one or more dielectric layers (such as 212, 212.1, 212.2, 212.3) disposed over sides of the first stack gate structure 201a, sides of the second stack gate structure 201b, and a portion of the top surface of the substrate 202; a first metal select gate 224a disposed over the high-k dielectric layer 212.2 and adjacent to the first stack gate structure 201a; a second metal select gate 224b disposed over the HK dielectric layer 212.2 and adjacent to the second stack gate structure 201b; a source region 210 in the substrate between the first stack gate structure 201a and the second stack gate structure 201b; a first drain region 218a in the substrate adjacent the first metal select gate 224a; and a second drain region 218b in the substrate adjacent the second metal select gate 224b. An interlayer dielectric 220 and 226 is disposed over the first and second stack gate structures, the high-k dielectric layer, the first and second metal select gates, the source region, and the first and second drain regions; a first contact 228 is operably coupled to the first drain region 218a through the interlayer dielectric; a second contact 228b is operably coupled to the second drain region 218b through the interlayer dielectric; and a third contact 230 is operably coupled to the source region 210 through the interlayer dielectric. A select gate 224 and a stack gate structure 201 are over the channel region between a source region 210 and a drain region 218.

The ILD layers described above may be comprised of silicon oxide. Alternatively, the ILD layer may include other dielectric materials such as silicon nitride, silicon oxynitride, TEOS formed oxide, phosphosilicate glass (PSG), borophosphosilicate glass (BPS G), low-k dielectric materials, other suitable dielectric materials, and/or combinations thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bis-benzocyclobutenes), SiLK® (Dow Chemical, Midland, Mich.), polyimide, other proper materials, and/or combinations thereof. An ILD layer may alternatively be a multilayer structure having multiple dielectric materials.

The source and drain contacts described above may be any of a variety of cross-sectional shapes. The source and drain contacts may also be comprised of various suitable conductive materials, such as copper or tungsten. In one embodiment, an opening may be etched through the ILD layer at a location above a source and/or drain region. The opening may then be filled with a metal. The above contact formation processes may include photolithography, etching, stripping, deposition, and any other appropriate procedures. Lastly, a CMP process is performed to planarize the top portions of the source and drain contacts and the ILD layer.

The layers described above (e.g., the polysilicon and metal layers) may each be formed using any suitable process, such as chemical vapor deposition (CVD), physical vapor deposition (PVD), atomic layer deposition (ALD), high density plasma CVD (HDPCVD), metal organic CVD (MOCVD), remote plasma CVD (RPCVD), plasma enhanced CVD (PECVD), plating, other suitable methods, and/or combinations thereof.

The layers may be patterned by any suitable process, such as by a photolithography patterning process, which may include any number of suitable steps including photoresist coating (e.g., spin-on coating), soft baking, mask aligning, exposure, post-exposure baking, developing the photoresist, rinsing, drying (e.g., hard baking), other suitable processes, and/or combinations thereof. Further, the photolithography exposing process may be wholly replaced by other proper methods, such as maskless photolithography, electron-beam writing, or ion-beam writing.

Additionally, the integrated circuit in the semiconductor device 200 can further include non-illustrated passive components such as resistors, capacitors, inductors, and/or fuses; and not-illustrated active components, such as MOSFETs including p-channel MOSFETs (pMOS transistors) and n-channel MOSFETs (nMOS transistors), complementary metal-oxide-semiconductor transistors (CMOSs), high voltage transistors, and/or high frequency transistors; other suitable components; and/or combinations thereof.

Figure 13:
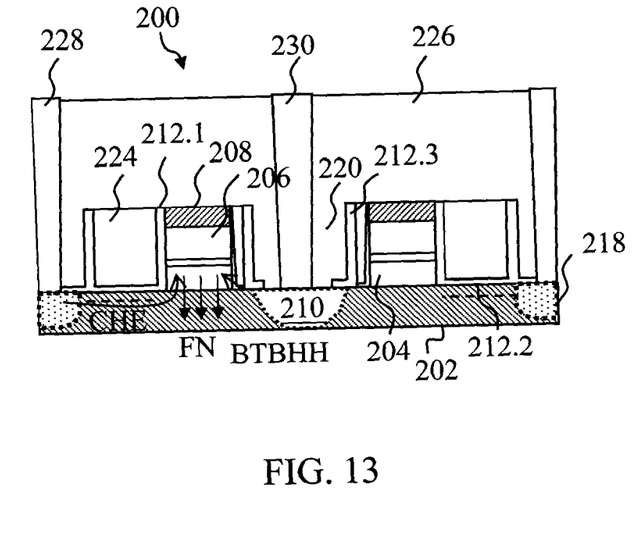
FIG. 13 illustrates program and erase functions in a semiconductor device in accordance with embodiments of the present disclosure.

FIG. 13 illustrates program and erase functions in semiconductor device 200 in accordance with embodiments of the present disclosure. Semiconductor device 200 does not include an erase gate.

Different bias voltages are used to determine the memory behavior of the storage element 204. For example, when the device 200 is programmed, the input bias voltage makes electrons/holes move from the channel region of the ion-implanted layer to the storage layer, and the state of the corresponding bit line shifts from 1/0 to 0/1. The mechanism of electron/hole movement depends on the type of the device layer. When the device layer is made of a p-type semiconductor material, the mechanisms of electron/hole movement include the FN (Fowler Nordheim) tunneling method from the gate structure or the channel region, SHH (Substrate Hot Hole) injection method, and BTBHE (Band-To-Band Hot Electron) injection method. When the device layer is made of an n-type semiconductor material, the mechanisms of electron/hole movement include the FN (Fowler Nordheim) tunneling method from the gate structure or the channel region, CHE (Channel Hot Electron) injection method, and BTBHH (Band-To-Band Hot Hole) injection method.

When the device 200 undertakes an erasing activity, the input bias voltage makes the electrons/holes move from the storage layer through the channel region of the ion-implanted layer to the exterior of the device, and the state of the corresponding bit line shifts from 0 to 1. Similarly, the mechanism of electron/hole movement also depends on the type of the device layer. When the device layer is made of a p-type semiconductor material, the mechanisms of electron/hole movement include the FN (Fowler Nordheim) tunneling method from the gate structure or the channel region, SHH (Substrate Hot Hole) injection method, and BTBHE (Band-To-Band Hot Electron) injection method. When the device layer is made of an n-type semiconductor material, the mechanisms of electron/hole movement include the FN (Fowler Nordheim) tunneling method from the gate stricture or the channel region, CHE (Channel Hot Electron) injection method, and BTBHH (Band-To-Band Hot Hole) injection method. When the device 200 undertakes a reading activity, the read current is an electron current if n-type ions are implanted into the ion-implanted layer, and the read current is a hole current if p-type ions are implanted into the ion-implanted layer.

In one example, device 200 provides a program function through a CHE injection method from drain 218 to storage element 204 and a BTBHE injection method from source 210 to storage element 204, and an erase function through an FN tunneling method from storage element 204 to substrate 202.

Figure 14:
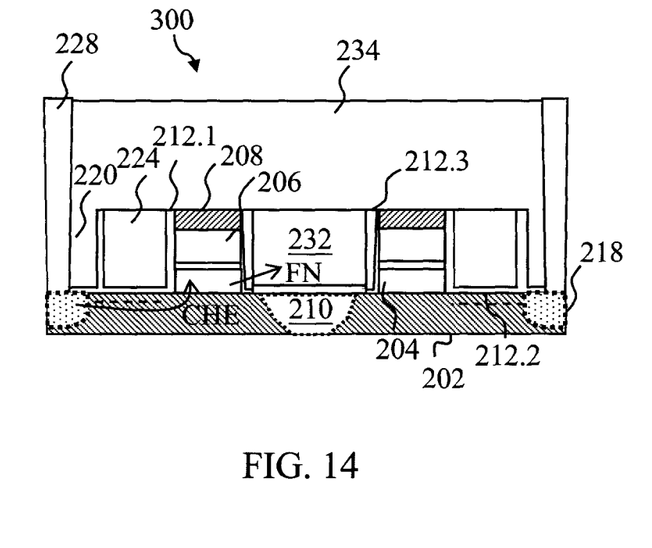
FIG. 14 illustrates another semiconductor device and program and erase functions thereof in accordance with embodiments of the present disclosure.

FIG. 14 illustrates another semiconductor device 300 and program and erase functions thereof in accordance with embodiments of the present disclosure. Semiconductor device 300 is substantially similar to device 200 and the same numbered features in device 200 and related descriptions are fully applicable in this embodiment with respect to device 300 although applicable descriptions may not be repeated here to avoid repetitive descriptions.

Device 300 includes a metal erase gate 232 disposed over the source region 210 and the high-k dielectric layer 212.2. An interlayer dielectric 234 is disposed over the erase gate 232, the storage element 204, the control gate 206, the high-k dielectric layer 212.2, the metal select gate 224, the source region 210, and the drain region 218. Contacts 228 are operably coupled to the drain region 218 through the interlayer dielectric.

In one example, device 300 provides a program function through a CHE injection method from drain 218 to storage element 204, and an erase function through an FN tunneling method from polysilicon storage element 204 to metal erase gate 232.

Figure 15:
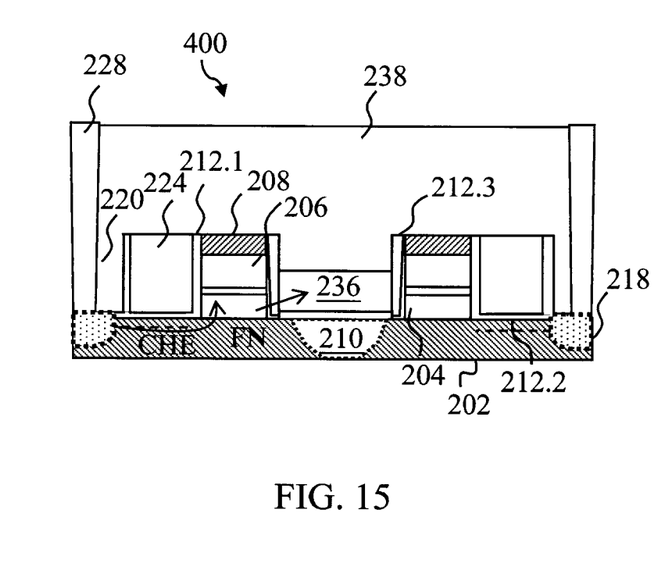
FIG. 15 illustrates another semiconductor device and program and erase functions thereof in accordance with embodiments of the present disclosure.

FIG. 15 illustrates another semiconductor device 400 and program and erase functions thereof in accordance with embodiments of the present disclosure. Semiconductor device 400 is substantially similar to device 200 and 300 and the same numbered features in device 200 and 300 and related descriptions are fully applicable in this embodiment with respect to device 400 although applicable descriptions may not be repeated here to avoid repetitive descriptions.

Device 400 includes a polysilicon erase gate 236 disposed over the source region 210 and the high-k dielectric layer 212.2. An interlayer dielectric 238 is disposed over the erase gate 236, the storage element 204, the control gate 206, the high-k dielectric layer 212.2, the metal select gate 224, the source region 210, and the drain region 218. Contacts 228 are operably coupled to the drain region 218 through the interlayer dielectric.

In one example, device 400 provides a program function through a CHE injection method from drain 218 to storage element 204, and an erase function through an FN tunneling method from polysilicon storage element 204 to polysilicon erase gate 232.

Advantageously, the semiconductor device of the present disclosure provides for integration of HKMG processing with select gates and high speed flash cells embedded in HKMG technology. Furthermore, the present disclosure allows for the low resistance of select gates to enhance read access speed of flash memory, and continued shrinking of flash technology through utilizing a HKMG core device as a select gate transistor.

The present disclosure provides for many different embodiments. One of the broader forms of the present disclosure involves a semiconductor device. The device includes a substrate having a top surface, a storage element disposed over the substrate, a control gate disposed over the storage element, and a high-k dielectric layer disposed over a portion of the top surface of the substrate. The device further includes a metal select gate disposed over the high-k dielectric layer and adjacent to the storage element and the control gate.

Another of the broader forms of the present disclosure involves another semiconductor device. The device includes a substrate having a top surface; a first stack gate structure including a first storage element disposed over the substrate and a first control gate disposed over the first storage element; a second stack gate structure including a second storage element disposed over the substrate and a second control gate disposed over the second storage element; a high-k dielectric layer disposed over sides of the first stack gate structure, sides of the second stack gate structure, and a portion of the top surface of the substrate; a first metal select gate disposed over the high-k dielectric layer and adjacent to the first stack gate structure; a second metal select gate disposed over the high-k dielectric layer and adjacent to the second stack gate structure; a source region in the substrate between the first stack gate structure and the second stack gate structure; a first drain region in the substrate adjacent the first metal select gate; and a second drain region in the substrate adjacent the second metal select gate.

Yet another of the broader forms of the present disclosure involves a method of fabricating a semiconductor device. The method includes providing a substrate having a top surface, forming a storage element over the substrate, forming a control gate over the storage element, forming a high-k dielectric layer over sides of the control gate, sides of the storage element, and a portion of the top surface of the substrate, and forming a metal select gate over the high-k dielectric layer and adjacent to the storage element and the control gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduce herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, the method comprising:
   providing a substrate;
   forming a storage element over the substrate;
   forming a control gate over the storage element;
   forming a dielectric capping layer over the control gate such that the dielectric capping layer physically contacts the control gate, the capping layer extends from a first dielectric sidewall spacer to a second dielectric sidewall spacer;
   forming a high-k dielectric layer over, and a portion of the top surface of the substrate;
   forming a metal select gate over the high-k dielectric layer and adjacent to the storage element and the control gate, wherein the metal select gate extends from the second dielectric sidewall spacer to a third dielectric sidewall spacer; and
   planarizing the dielectric capping layer, the metal select gate, the first dielectric sidewall spacer, the second dielectric sidewall spacer, and the third dielectric sidewall spacer such that a topmost surface of the dielectric capping layer, a topmost surface of the metal select gate, a topmost surface of the first dielectric sidewall spacer, a topmost surface of the second sidewall spacer, and a topmost surface of the third sidewall spacer are substantially coplanar.

2. The method of claim 1, further comprising simultaneously fabricating with the high-k dielectric layer, a high-k metal gate (HKMG) metal oxide semiconductor (MOS) over a complementary metal oxide semiconductor (CMOS) region of the substrate.

3. The method of claim 1, further comprising simultaneously fabricating with the metal select gate, a metal oxide semiconductor (MOS) over a complementary metal oxide semiconductor (CMOS) region of the substrate.

4. The method of claim 1, further comprising:
   forming a source region in the substrate adjacent the storage element and the control gate; and forming a drain region in the substrate adjacent the select gate.

5. The method of claim 4, further comprising:

forming an interlayer dielectric over the storage element, the control gate, the high-k dielectric layer, the metal select gate, the source region, and the drain region;

forming a first contact operably coupled to the source region through the interlayer dielectric; and forming a second contact operably coupled to the drain region through the interlayer dielectric.

6. The method of claim 5, further comprising:

forming an erase gate over the source region and the high-k dielectric layer;

forming an interlayer dielectric over the erase gate, the storage element, the control gate, the high-k dielectric layer, the metal select gate, the source region, and the drain region; and forming a contact operably coupled to the drain region through the interlayer dielectric.

7. A method comprising:

forming a storage element over a substrate;

forming a control gate over the storage element;

forming a dielectric capping layer over the control gate;

forming a select gate over the substrate and adjacent to the storage element and the control gate;

forming an erase gate over the substrate and adjacent to the storage element and the control gate; and planarizing the dielectric capping layer, the select gate, and the erase gate such that a topmost surface of the dielectric capping layer, a topmost surface of the select gate, and a topmost surface of the erase gate are substantially coplanar.

8. The method of claim 7, further comprising forming a source region in the substrate adjacent to the storage element and the control gate; and forming a drain region in the substrate adjacent to the select gate, wherein the storage element and the control gate are closer to the source region than the drain region.

9. The method of claim 7, further comprising forming a source region in the substrate adjacent to the storage element and the control gate, and wherein forming the erase gate over the substrate and adjacent to the storage element and the control gate includes forming the erase gate directly over the source region.

10. The method of claim 7, further comprising after planarizing the dielectric capping layer, the select gate, and the erase gate, forming an interlayer dielectric layer over the dielectric capping layer, the select gate, and the erase gate.

11. The method of claim 7, wherein the select gate includes a metal material.

12. The method of clam 7, wherein the erase gate includes a metal material.

13. A method comprising:

forming a storage element over a substrate;

forming a control gate over the storage element;

forming a capping layer over the control gate; forming a dielectric sidewall spacer along a sidewall of the capping layer;

forming a select gate adjacent to the dielectric sidewall spacer, the storage element and the control gate; and planarizing the capping layer, the dielectric sidewall spacer, and the select gate such that a topmost surface of the capping layer, a topmost surface of the dielectric sidewall spacer, and a topmost surface of the metal select gate are substantially coplanar.

14. The method of claim 13, further comprising forming an erase gate adjacent to the storage element and the control gate.

15. The method of claim 14, wherein the erase gate has a topmost surface that is substantially coplanar with the topmost surface of the capping layer and the topmost surface of the select gate.

16. The method of claim 14, wherein the erase gate includes a polysilicon material.

17. The method of claim 14, wherein the erase gate includes a metal material.

18. The method of claim 13, further comprising forming a source/drain feature in the substrate; and forming a contact feature over the source/drain feature.

19. The method of claim 13, wherein the select gate includes a metal material.

20. The method of claim 13, wherein the storage element includes one of a polysilicon floating gate, a nano-crystal film, and a nitride film.

* * * * *